(12) United States Patent
Chapelon et al.

(10) Patent No.: US 8,518,802 B2
(45) Date of Patent: Aug. 27, 2013

(54) PROCESS FOR FABRICATING INTEGRATED-CIRCUIT CHIPS

(75) Inventors: Laurent-Luc Chapelon, Domene (FR); Julien Cuzzocrea, Grenoble (FR)

(73) Assignee: STMicroelectronics (Crolles 2) SAS, Crolles Cedex (FR)

( * ) Notice: Subject to any disclaimer, the term of this patent is extended or adjusted under 35 U.S.C. 154(b) by 0 days.

(21) Appl. No.: 13/315,441

(22) Filed: Dec. 9, 2011

(65) Prior Publication Data

US 2012/0153425 A1    Jun. 21, 2012

(30) Foreign Application Priority Data

Dec. 16, 2010  (FR) ...................................... 10 60639

(51) Int. Cl.
*H01L 21/00*    (2006.01)

(52) U.S. Cl.
USPC ........................... 438/462; 438/458; 257/499

(58) Field of Classification Search
USPC ........... 257/449, 499, 618, 620, 622; 438/33, 438/68, 113, 458, 462, 464, 598, 637, 680, 438/691
See application file for complete search history.

(56) References Cited

U.S. PATENT DOCUMENTS

| | | | |
|---|---|---|---|
| 5,925,924 A | 7/1999 | Cronin et al. | |
| 6,107,213 A | 8/2000 | Tayanaka | |
| 6,326,279 B1 | 12/2001 | Kakizaki et al. | |
| 6,331,208 B1 | 12/2001 | Nishida et al. | |
| 6,426,235 B1 | 7/2002 | Matsushita et al. | |
| 6,551,905 B1 | 4/2003 | Barsky et al. | |
| 6,605,518 B1 | 8/2003 | Ohmi et al. | |
| 6,649,485 B2 | 11/2003 | Solanki et al. | |
| 7,033,863 B2 * | 4/2006 | Tokushige | 438/113 |
| 7,157,352 B2 | 1/2007 | Yamanaka | |
| 7,935,571 B2 | 5/2011 | Ramiah et al. | |
| 8,394,677 B2 | 3/2013 | Sakurada | |
| 2005/0052219 A1 | 3/2005 | Butler et al. | |
| 2006/0043534 A1 * | 3/2006 | Kirby et al. | 257/618 |
| 2006/0138629 A1 | 6/2006 | Fukazawa | |
| 2006/0205161 A1 | 9/2006 | Das et al. | |
| 2007/0200877 A1 | 8/2007 | Arakawa | |
| 2011/0300715 A1 | 12/2011 | Ravi et al. | |

FOREIGN PATENT DOCUMENTS

EP    1439577 A2    7/2004

OTHER PUBLICATIONS

French Search Report and Written Opinion for FR 1060639 dated Aug. 16, 2011 (7 pages).

* cited by examiner

*Primary Examiner* — N Drew Richards
*Assistant Examiner* — Christina Sylvia
(74) *Attorney, Agent, or Firm* — Gardere Wynne Sewell LLP

(57) ABSTRACT

Integrated-circuit chips are fabricated according to a process wherein weak portions are formed in a substrate wafer surrounding a plurality of locations. An integrated-circuit chip is defined at each location by destroying the weak portions so as to singulate integrated-circuit chips.

13 Claims, 8 Drawing Sheets

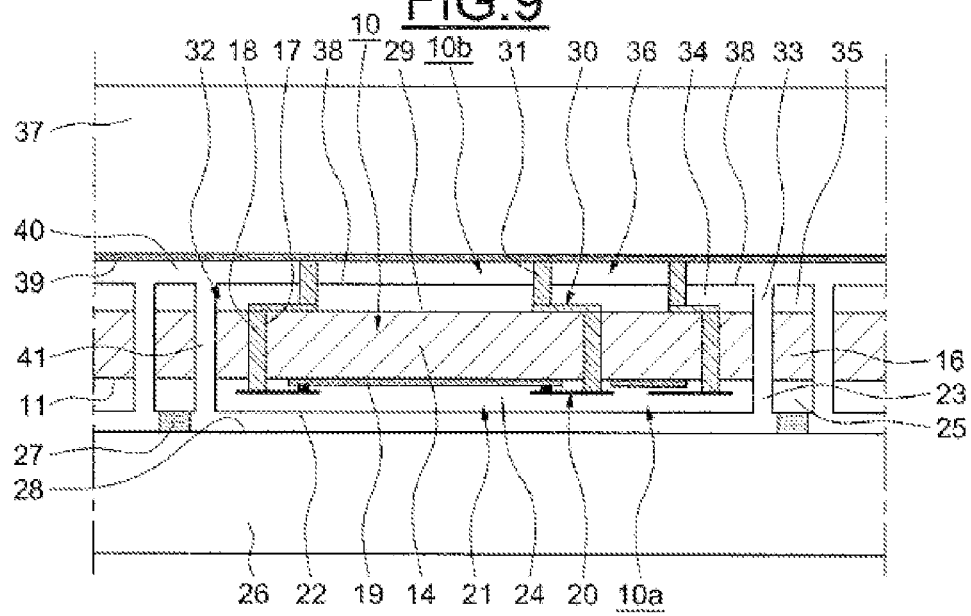
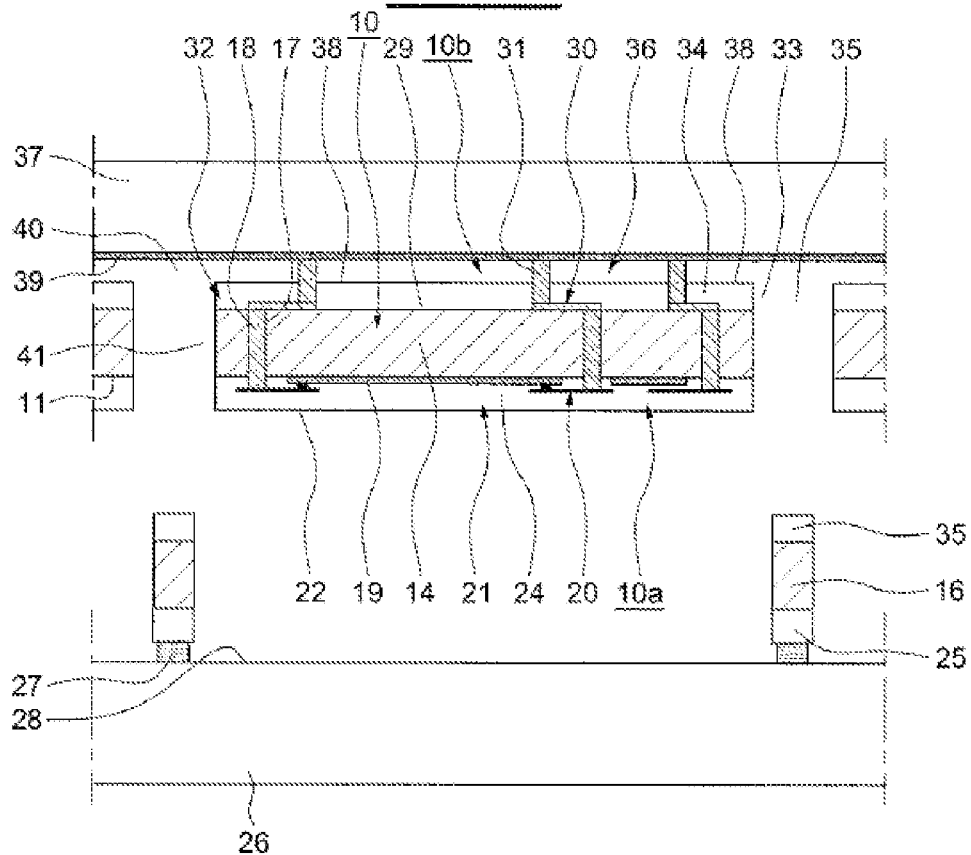

PROCESS FOR FABRICATING INTEGRATED-CIRCUIT CHIPS

PRIORITY CLAIM

This application claims priority from French Application for Patent No. 1060639 filed Dec. 16, 2010, the disclosure of which is hereby incorporated by reference.

TECHNICAL FIELD

The present invention relates to the field of integrated-circuit chips and to their fabrication processes.

BACKGROUND

When integrated-circuit chips are produced by wafer-scale fabrication using reinforcing support wafers, often called carriers, there is a difficulty related to removal of these support wafers. In particular using adhesive as a temporary bonding means between the integrated-circuit wafer and the support wafer limits to about 240° C. the temperature of operations that may be carried out while the support wafer is present, in order for it to be subsequently possible to dissolve said adhesive so as to remove the support wafer, thereby complicating the fabrication process.

Moreover, currently, to singulate integrated-circuit chips produced by wafer-scale fabrication, mechanical cutting tools are used, generally saws. Such mechanical tools require tools for holding the wafers and cause vibrations that may degrade the integrated-circuit chips or at least reduce their quality.

SUMMARY

According to one embodiment, a fabrication process is provided that obviates at least partially the aforementioned drawbacks.

A process is provided for fabricating integrated-circuit chips, which may comprise: producing weak portions in a substrate wafer, about a plurality of locations; producing a plurality of integrated-circuit chips in said locations, including respectively the portions of said substrate wafer corresponding to said locations; and destroying said weak portions so as to singulate integrated-circuit chips.

The process may comprise: producing weak portions in a thick substrate wafer, about a plurality of locations, from a front side; producing front-side integrated parts for integrated-circuit chips on the locations of the thick substrate wafer; mounting a support wafer on the side of said front-side integrated parts; thinning the substrate wafer from the back side; producing back-side integrated parts for the integrated-circuit chips on the thinned substrate wafer; and destroying said weak portions so as to singulate integrated-circuit chips.

The process may comprise: producing, from the front side and/or from the back side, electrical connection vias that pass through the substrate wafer and connect the front-side parts and back-side parts.

According to another embodiment, a process is provided for fabricating integrated-circuit chips, which may comprise: producing in a substrate wafer, from a front side of the latter, weak portions about locations; producing in said locations, on the front side of the substrate wafer, front-side integrated parts comprising integrated circuits and front-side electrical connection networks in a front-side layer forming a front-side face, and holes in the substrate wafer containing an electrically conductive material so as to form electrical connection vias connected selectively to said front-side electrical connection networks; fixing a support wafer in a position such that said front-side face of said front-side layer is on a bearing face of this support wafer; thinning the substrate wafer from its back-side face so as to expose said weak portions and said electrical connection vias; producing in said locations back-side integrated parts comprising back-side means for external electrical connection on the back-side face of the thinned substrate wafer, these back-side connection means being selectively connected to said electrical connection vias; and destroying the weak portions of the substrate wafer so as to singulate integrated-circuit chips formed in said locations.

The process may comprise: producing in the substrate wafer weak portions that are deeper than the holes of the electrical connection vias.

According to another embodiment, a process is provided for fabricating integrated-circuit chips, which process may comprise: producing in a substrate wafer, from a front-side face of the latter, weak portions, about locations; producing in said locations, on the front-side face of the substrate wafer, front-side integrated parts comprising integrated circuits and front-side electrical connection networks in a front-side layer having a front-side face; fixing a support wafer to said front-side face; thinning the substrate wafer from its back-side face so as to expose said weak portions; producing in said locations holes in the thinned substrate wafer from its back-side face and introducing into these holes an electrically conductive material so as to form electrical connection vias selectively connected to said front-side electrical connection networks, and back-side integrated parts comprising back-side external electrical connection means on the back-side face of the thinned substrate wafer, these connection means being selectively connected to said electrical connection vias; and destroying the weak portions of the substrate wafer so as to singulate the integrated-circuit chips formed in said locations.

The process may comprise: producing a plurality of weak portions respectively about said locations, spaced apart from one another; and fixing the support wafer on said front-side face by way of regions or beads of holding adhesive which lie between said weak portions.

The process may comprise: producing weak portions along rows and column that cross one another; and fixing the support wafer on said front-side face by way of regions of holding adhesive lying in said locations.

The process may comprise: mounting a transfer wafer onto the front-side face of the integrated-circuit chips, before the weak portions have been destroyed.

The process may comprise: mounting the transfer wafer on the chips by way of an adhesive layer.

The substrate wafer may comprise a silicon wafer and the weak portions comprise porous silicon resulting from an electrochemical etch of this silicon wafer.

According to one embodiment, a wafer of integrated circuits is also provided, which may comprise a substrate wafer and, in locations, a plurality of integrated-circuit chips including respectively portions of said substrate wafer, said substrate wafer comprising weak portions between said locations.

The substrate wafer of this wafer of integrated circuits may comprise a silicon wafer and the weak portions comprise porous silicon.

BRIEF DESCRIPTION OF THE DRAWINGS

Methods for fabricating integrated-circuit chips will now be described by way of non-limiting examples, illustrated by the drawings in which:

FIGS. 3 to 10 show cross sections through integrated-circuit chips during fabrication, in various fabrication steps, according to said fabrication method;

DETAILED DESCRIPTION OF THE DRAWINGS

With reference to FIGS. 1 to 10, an embodiment of a wafer-scale process for fabricating integrated-circuit chips will be described.

Figure 1:
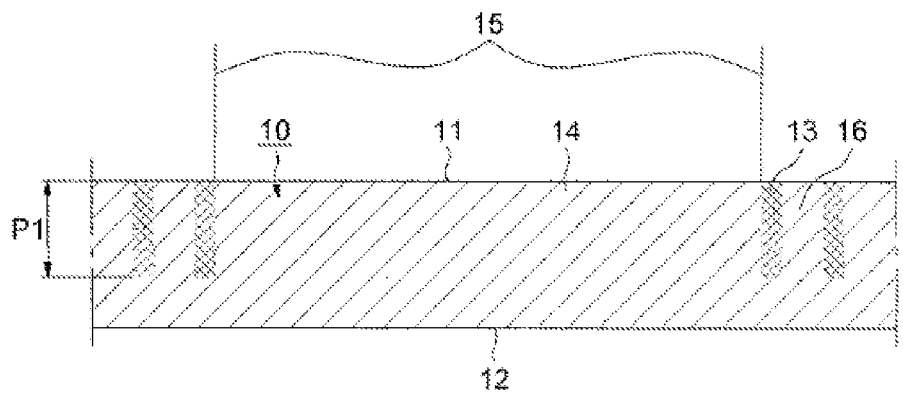
FIG. 1 shows a cross section through integrated-circuit chips during production, according to one fabrication method.
Figure 2:
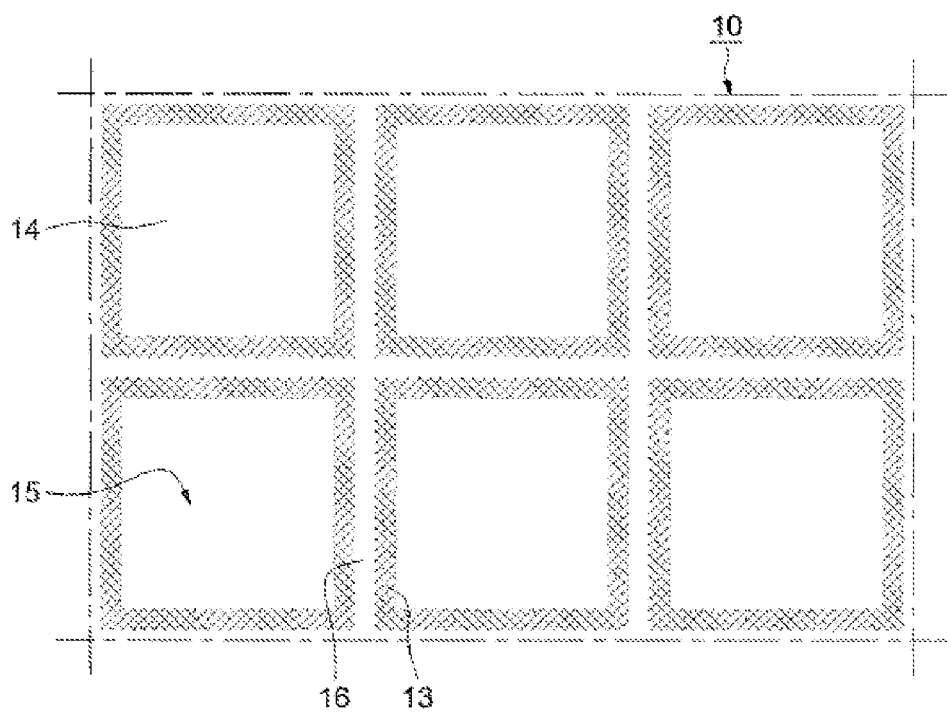
FIG. 2 shows a top view of FIG. 1.

As illustrated in FIGS. 1 and 2, starting with a thick substrate wafer 10 having a front side 11 and a back side 12, a plurality of blind weak portions 13 that are for example rectangular or square are produced in this substrate wafer 10 from its front side 11 to a depth P1. These weak portions 13 surround main portions 14 forming locations 15 and having between them transition portions 16.

Since the substrate wafer 10 is for example made of silicon, the weak portions 13 may be formed of porous silicon resulting from a suitable electrochemical etch of the silicon, by electrolysis in a hydrofluoric acid electrolyte, by way of through-holes in a mask.

Figure 3:
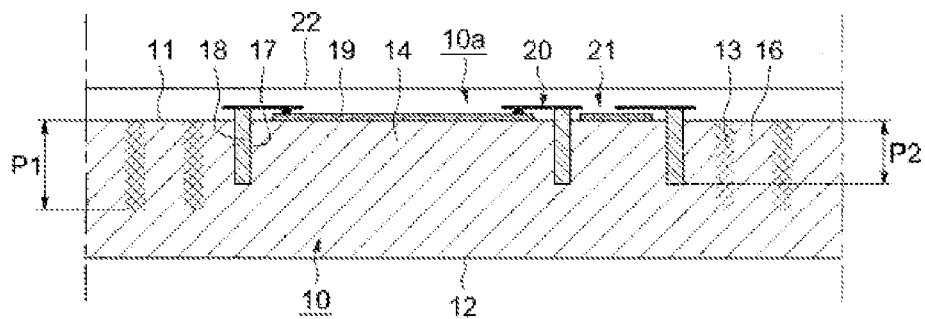

Next, as illustrated in FIG. 3, blind holes 17 are produced in the locations 15 in main portions 14 of the substrate wafer 10 from its front side 11, and an electrically conductive material is introduced into these holes so as to form electrical connection vias 18. The holes 16 may be produced to a depth P2 equal to the depth P1 of the weak portions 13. Nevertheless, it is desirable for the depth P1 of the weak portions 13 to be greater than the depth P2 of the holes 16.

Next, front-side integrated parts 10a comprising integrated circuits 19 and front-side electrical connection networks 20 are produced in the locations 15 on the front side 11 of the substrate wafer 10 in a front-side layer 21 having a front-side face 22, these front-side electrical interconnection networks 20 selectively connecting the electrical connection vias 18 and the integrated circuits 19. The electrical connection vias 18 may for example be connected to the first metallization levels of the electrical interconnection networks 20.

In a variant embodiment, it would be possible to produce the integrated circuits 19 first and then the electrical connection vias 18 and the front-side electrical interconnection networks 20, at the same time as the front-side layer 21.

Figure 4:
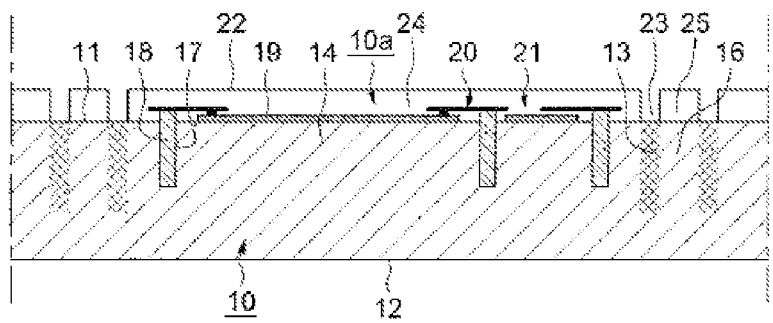

Next, as illustrated in FIG. 4, a plurality of grooves 23 are produced through the layer 21, about locations 15, so as to expose the front side of the weak portions 13. The front-side layer 21 then has, within the grooves 23, main portions 24 located on main portions 14 of the substrate wafer 10 and, between these grooves 23, transition portions 25 located on transition portions 16 of the substrate wafer 10.

Figure 5:
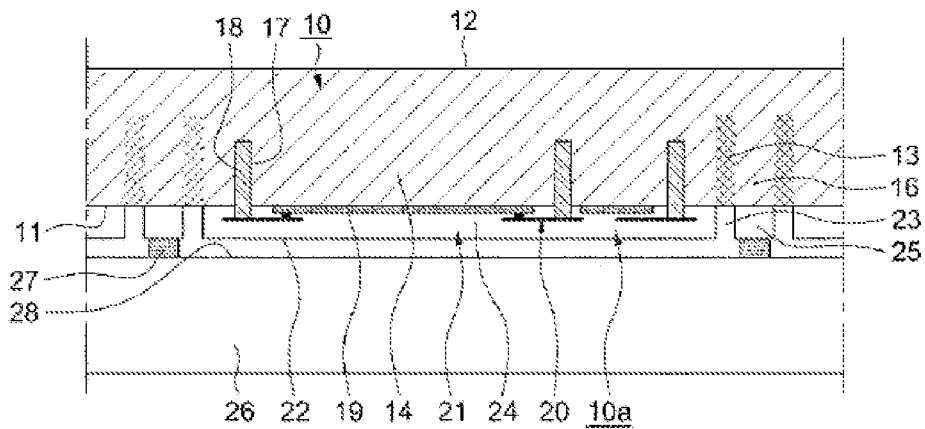

Next, as illustrated in FIG. 5, the substrate wafer 10 is mounted on a front-side support wafer 26, on the side of the front-side face 11 of the substrate wafer 10, i.e. on the side of the front-side face 22 of the front-side layer 21, by way of regions or beads of holding adhesive 27 which lie between the transition portions 25 of the front-side layer 21 and the back-side bearing face 28 of the front-side support wafer 26.

Figure 6:
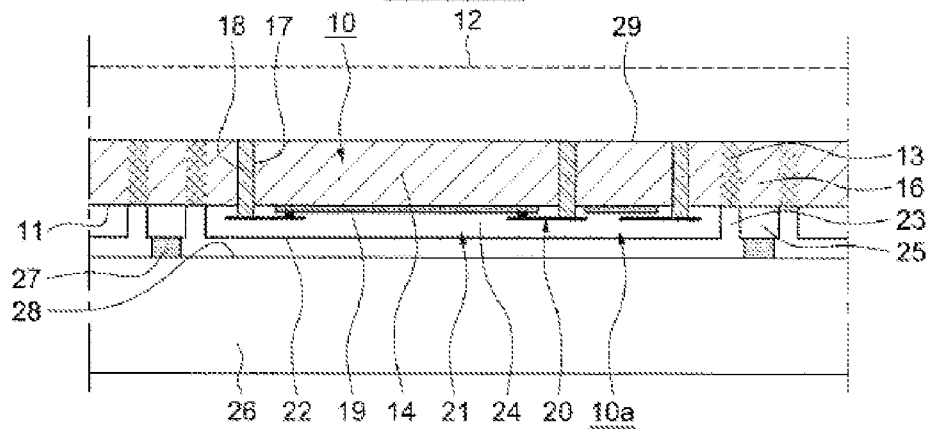

Next, as illustrated in FIG. 6, the substrate wafer 10 is thinned from its back-side face, until the weak portions 13 and the electrical connection vias 18 are exposed from the back side, optionally cutting away the ends of the weak portions 13 if the depth P1 is greater than the depth P2. It follows that the weak portions 13 and the electrical connection vias 18 pass through the thinned substrate wafer 10 that then has a back-side face 29. This thinning may be carried out using a chemical-mechanical polish.

Figure 7:
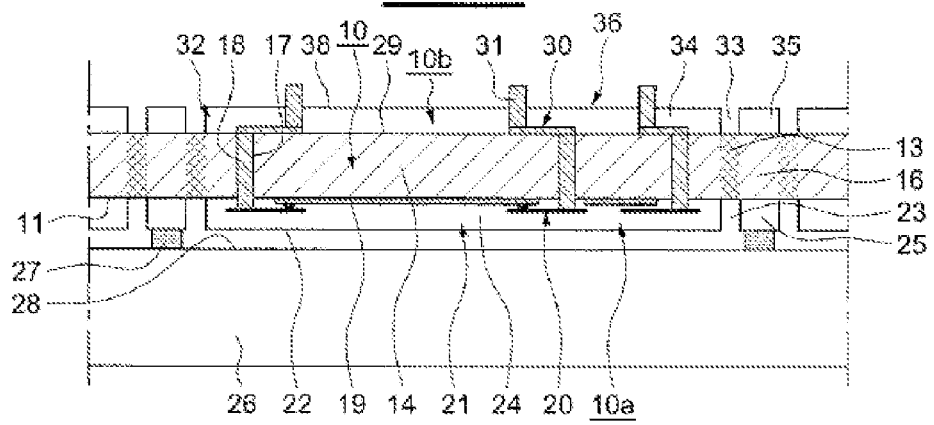

Next, as illustrated in FIG. 7, back-side integrated parts 10b comprising back-side external electrical connection means 30 are produced in the locations 15 on the back-side face 29 of the thinned substrate wafer 10, these back-side external electrical connection means 30 being selectively connected, from the back side, to the electrical connection vias 18.

These back-side external electrical connection means 30 may comprise electrical connection studs or bumps 31 that protrude relative to a back-side layer 32 in which through-grooves 33 are arranged on weak portions 13, so that these weak portions 13 are, on the back side, exposed or not covered. The back-side layer 32 then has main portions 34, in the locations 15, on the thinned main portions 14 of the thinned substrate wafer 10 and transition portions 35 on the thinned transition portions 16 of the thinned substrate wafer 10.

Integrated-circuit chips 36 are thus obtained in the locations 15, respectively comprise the thinned main portions 14 of the thinned substrate wafer 10, the front-side integrated parts 10a formed by the integrated circuits 19, the electrical interconnection networks 20, with the main parts 24 of the front-side layer 21, the back-side integrated parts 10b formed by the back-side electrical connection means 30 and the main parts 34 of the back-side layer 32, and the corresponding electrical connection through-vias 18. The integrated-circuit chips 36 are connected to one another by the weak portions 13 and the transition portions 16 of the thinned substrate wafer 10.

Figure 8:
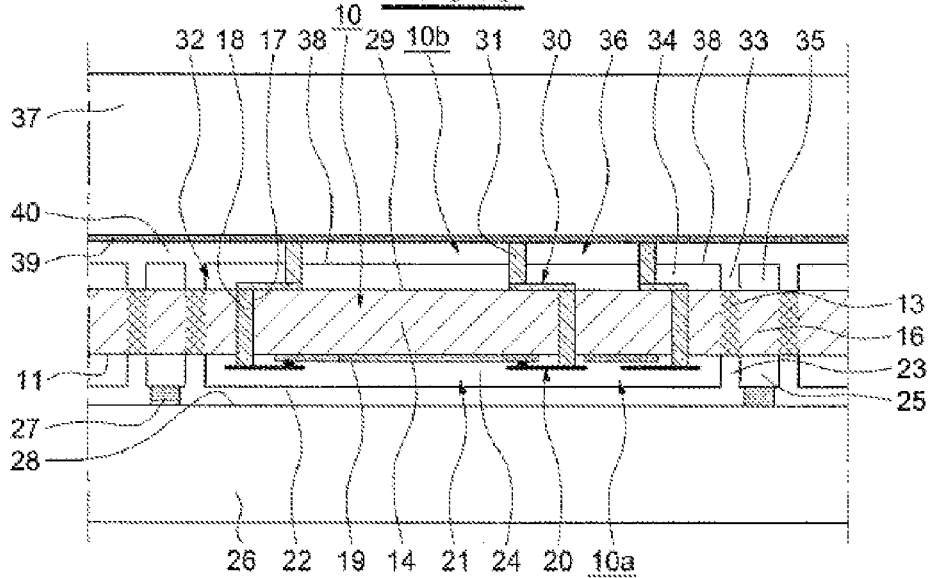

Next, as illustrated in FIG. 8, it is possible to mount a back-side transfer wafer 37 on the side of the back-side face 38 of the back-side layer 32, this transfer wafer 37 possibly being equipped with an adhesive layer 39 to which the back-side ends of the studs or bumps 31 are bonded, such that there remains a gap 40 between the back-side face 38 of the back-side layer 32 and the back-side transfer wafer 37.

Next, as illustrated in FIG. 9, the weak portions 13 are destroyed by way of a chemical etch, for example by immersing the assembly in a potassium hydroxide solution, the etchant reaching the weak portions 13 by way of the back side by passing through the gap 40. It follows that there are then through-passages 41 about integrated-circuit chips 36 that are thus singulated.

Next, as illustrated in FIG. 10, the front-side support wafer 26 and the back-side transfer wafer 37 are separated, at right angles one relative to the other. While doing this, the back-side transfer wafer 37 takes with it the then singulated integrated-circuit chips 36, whereas the front-side support wafer 26 takes with it the transition portions 14 of the thinned substrate wafer 10, the transition portions 23 of the front-side layer 20 and the transition portions 35 of the back-side layer 32 and the adhesive 27. Thus the holding adhesive 27, since it does not have to be dissolved to free the integrated-circuit chips, may be chosen from permanent adhesives that withstand higher temperatures, such that the fabrication operations described may be carried out at higher temperatures.

The singulated integrated-circuit chips 36, borne by the transfer wafer 37, may then be transferred, with no cleaning.

Figure 11:
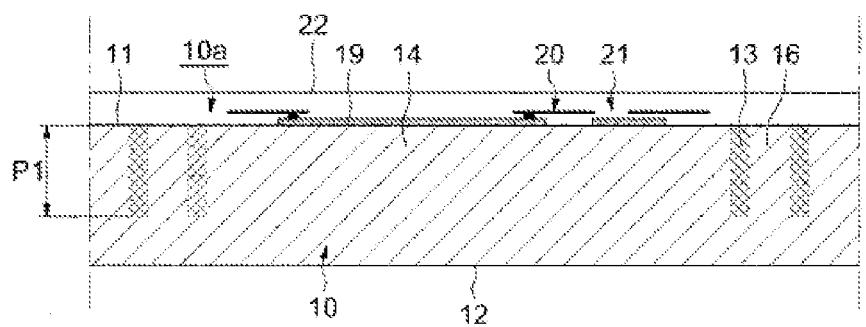
FIGS. 11 and 12 show cross sections through integrated-circuit chips during fabrication, according to a variant embodiment of said fabrication method.
Figure 12:
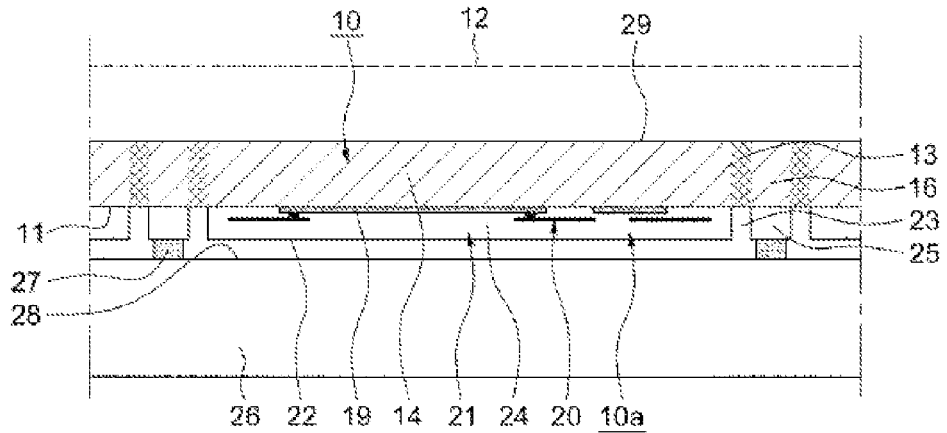

Referring to FIGS. 11, 12 then 7, a variant embodiment of the integrated-circuit chips 36, in which the electrical connection vias 18 are not fabricated in the same step, will be described.

As illustrated in FIG. 11, in the step corresponding to FIG. 3, only integrated circuits 19 and electrical interconnection networks 20 are produced with the front-side layer 21, no electrical connection vias 18 being produced.

As illustrated in FIG. 12, in the step corresponding to FIG. 6, the substrate wafer 10 is thinned from the back side so as to expose or partially remove the back-side parts of the weak portions 13 and obtain the back-side face 29.

Next, in the step shown in FIG. 7, holes 17 are produced, through the thinned substrate wafer 10, from the back side, for example as far as the first metallization level of the front-side interconnection networks 20, a conductive material is introduced into these holes 17 so as to form electrical connection vias 18, and then back-side external electrical connection means 30 are produced.

Referring to FIGS. 13 to 19, another variant method for wafer-scale production of integrated-circuit chips will be described, in which the same references as those used in the example described with reference to FIGS. 1 to 10 are employed.

Figure 13:
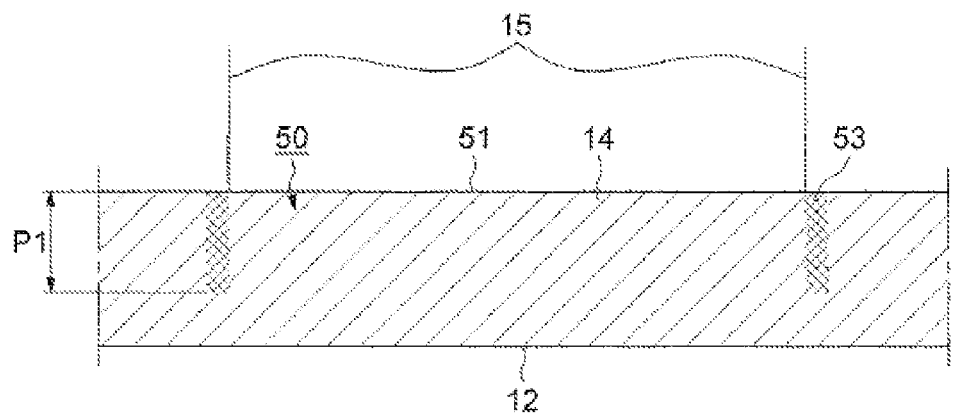
FIG. 13 shows a cross section through integrated-circuit chips during production, according to another fabrication method.
Figure 14:
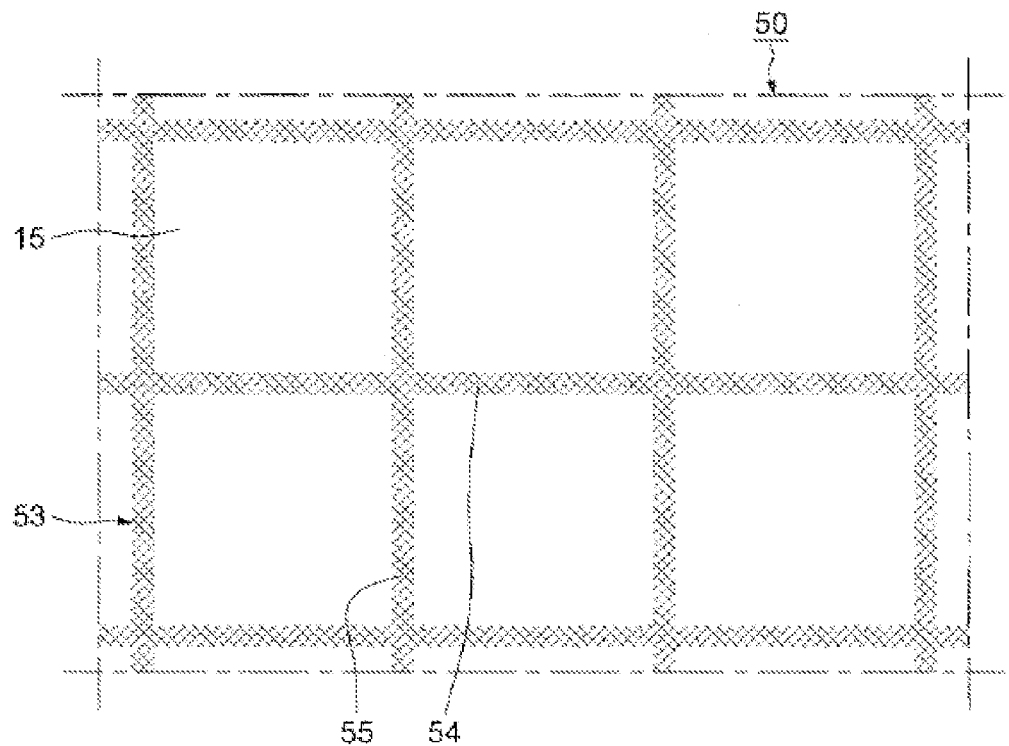
FIG. 14 shows a top view of FIG. 13.

As illustrated in FIGS. 13 and 14, starting with a thick substrate wafer 50 having a front side 51 and a back side 52, a plurality of weak portions 53 are produced in this substrate wafer 50, from its front-side face 51, along rows 54 and columns 55 that cross one another at right angles. These rows 54 and columns 55 of the weak portions 53 define between them main portions 14 of the substrate wafer 50, forming locations 15.

Figure 15:
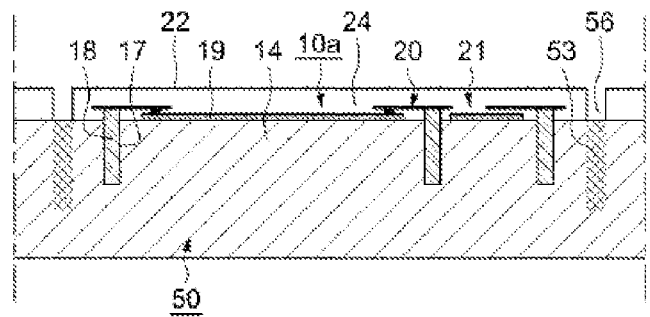
FIGS. 15 to 19 show cross sections through integrated-circuit chips during fabrication, in various fabrication steps, according to said other fabrication method.

Next, as illustrated in FIG. 15, in a similar manner to FIG. 3, integrated circuits 19, holes 17 filled with a conductive material so as to form electrical connection vias 18, and electrical interconnection networks 20 are produced on the side of the front-side face 51 of the substrate wafer 50, in the locations 15, in a front-side layer 21 that has a front-side face 22.

Next, in a similar manner to FIG. 4, grooves 56 are produced through the front-side layer 21, above weak portions 53 so as to expose these weak portions 53 on the front side.

Figure 16:
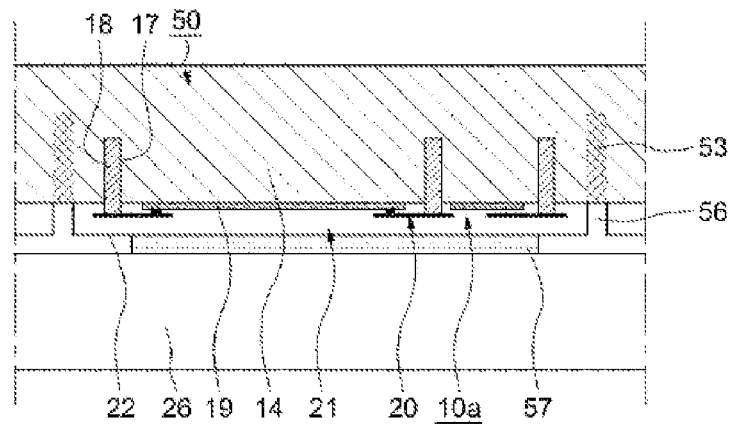

Next, as illustrated in FIG. 16, in a similar manner to FIG. 5, the substrate wafer 50 is mounted on a front-side support wafer 26 by way of a holding adhesive layer 57 that, this time, lies between the front-side face 22 of the front-side layer 21 and the back-side bearing face 28 of the support wafer 26, in the regions of the locations 15.

Figure 17:
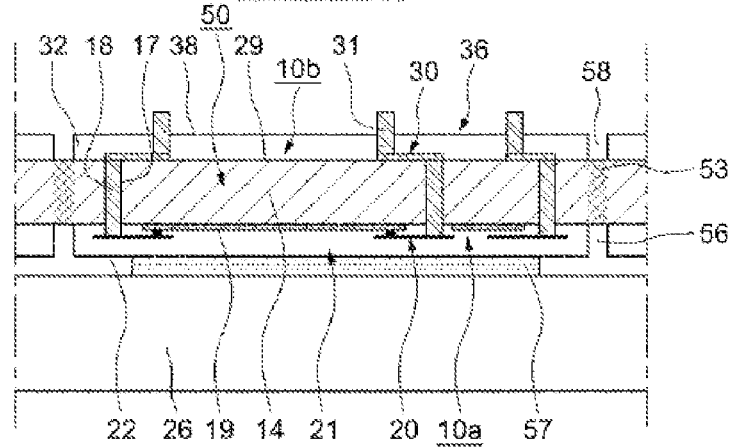

Next, as illustrated in FIG. 17, in a similar manner to FIG. 6, the substrate wafer is thinned from the back side so as to expose, on the back side, the weak portions 53 and the electrical connection vias 18, and obtain a back-side face 29. Next, in a similar manner to FIG. 7, electrical connection means 30 are produced in a back-side layer 32 in which through-grooves 58 are produced above weak portions 53, the electrical connection means 30 comprising electrical connection studs or bumps 31 that protrude relative to the back-side layer 32.

Thus, as above, integrated-circuit chips 36 are obtained in the locations 15.

Figure 18:
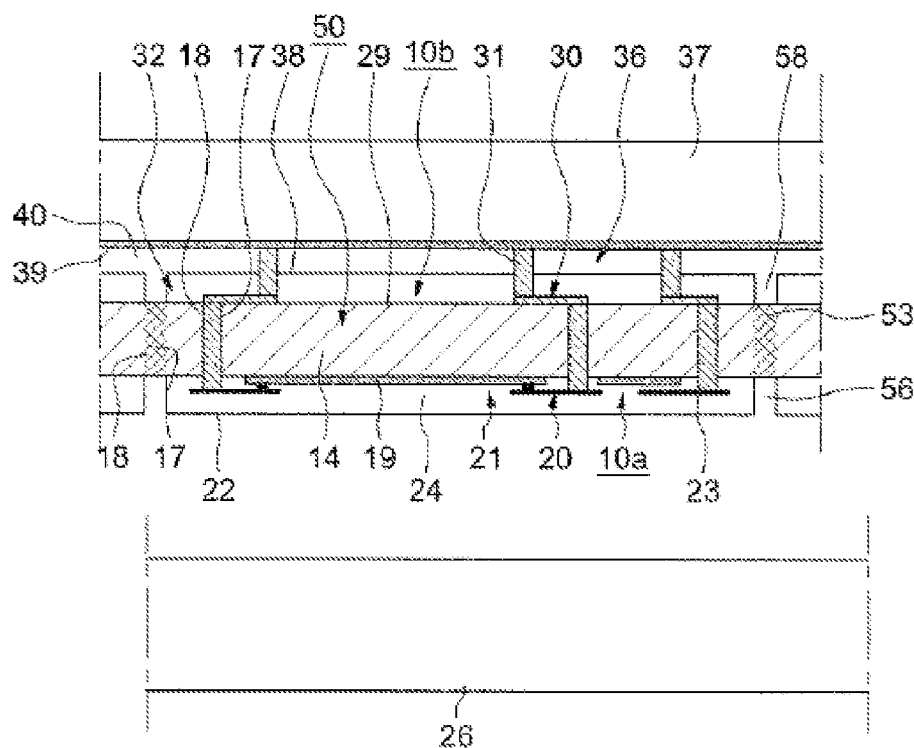

Next, as illustrated in FIG. 18, in a similar manner to FIG. 8, it is possible to mount a back-side transfer wafer 37, possibly equipped with an adhesive layer 39 on which the back-side ends of the studs or bumps 31 are bonded, such that there remains a gap 40 between the back-side face 38 of the back-side layer 32 and the back-side transfer wafer 37. Next, this time, the support wafer 26 is removed, for example by heating the holding adhesive layer 57 and by sliding the support wafer 37.

Figure 19:
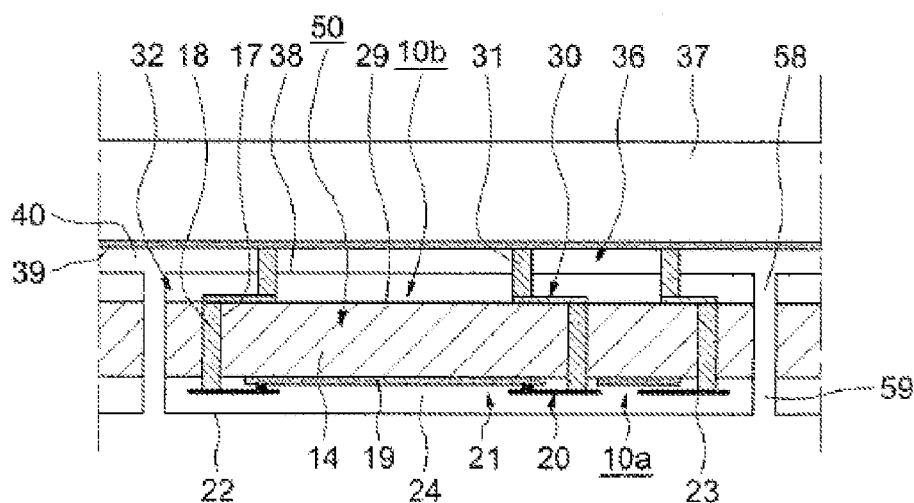

Next, as illustrated in FIG. 19, in a similar manner to FIG. 9, the weak portions 53 are destroyed by chemical etching, for example by immersing the assembly in a bath, the etchant reaching the weak portions 53 by way of the back side by passing through the gap 40 and by way of the front side. There are then through-passages 59 about integrated-circuit chips 36 that are thus singulated. It may be useful to clean the front-side faces 22 of the chips obtained 36 so as to remove the residual adhesive 57.

It follows from the described embodiments that the support wafers may be easily mounted and demounted and that the integrated-circuit chips may be singulated statically, without the risk of mechanical degradation.

The present invention is not limited to the examples described above. In particular, the structural and functional features of the fabrication methods and of the integrated-circuit chips may be combined differently. Many other variant embodiments are possible without departing from the scope defined by the appended claims.

What is claimed is:

1. A process for fabricating integrated-circuit chips, comprising:
   producing a plurality of separate encircling weak portions of porous silicon in a silicon substrate wafer, said separate encircling porous silicon weak portions surrounding a plurality of first locations, the plurality of encircling porous silicon weak portions being spaced apart from one another by transition regions and each encircling porous silicon weak portion surrounding one first location;
   producing a plurality of integrated-circuit chips in said first locations, including respectively portions of said substrate wafer corresponding to said first locations;
   fixing a support wafer to a front-side of said silicon substrate wafer, said fixing occurring by way of regions of holding adhesive fixing said support wafer to the front-side at said transition regions; and
   destroying said porous silicon weak portions so as to singulate said integrated-circuit chips.

2. The process according to claim 1:
   wherein producing separate encircling weak portions comprises producing blind porous silicon weak portions in the front-side; and
   wherein producing the plurality of integrated-circuit chips comprises:
   producing front-side integrated parts for integrated-circuit chips on the first locations;
   thinning the substrate wafer from a back side to reach said blind porous silicon weak portions; and
   producing back-side integrated parts for the integrated-circuit chips on the thinned substrate wafer.

3. The process according to claim 2, comprising: producing, from a front side of the wafer, a plurality of electrical connection vias that pass through the substrate wafer and connect the front-side and back-side integrated parts.

4. The process according to claim 3, wherein producing porous silicon weak portions comprises producing porous silicon weak portions that are deeper than holes for the electrical connection vias.

5. The process according to claim 1, comprising: producing, from a back side of the wafer, a plurality of electrical connection vias that pass through the substrate wafer and connect the front-side and back-side integrated parts.

6. The process according to claim 1, further comprising: mounting a transfer wafer onto a face of the integrated-circuit chips before the porous silicon weak portions have been destroyed.

7. The process according to claim 6, wherein mounting the transfer wafer comprises mounting the transfer wafer by way of an adhesive layer.

8. The process according to claim 1, wherein the porous silicon weak portions are produced by way of an electrochemical etch of said silicon substrate wafer.

9. A process for fabricating integrated-circuit chips, comprising:
producing from a front side of a silicon substrate wafer a plurality of separate encircling porous silicon weak portions which surround first locations, the plurality of encircling porous silicon weak portions being spaced apart from one another by transition regions, and each encircling porous silicon weak portion surrounding one first location;
producing in said first locations, on the front side of the substrate wafer, front-side integrated parts comprising integrated circuits and front-side electrical connection networks in a front-side layer forming a front-side face;
producing from a front side a plurality of holes in the substrate wafer containing an electrically conductive material so as to form electrical connection vias connected selectively to said front-side electrical connection networks;
fixing a support wafer in a position such that said front-side face of said front-side layer is on a bearing face of this support wafer, wherein fixing the support wafer comprises fixing the support by way of regions of holding adhesive fixing said support wafer to said bearing face at said transition regions;
thinning a back side of the substrate wafer so as to expose said porous silicon weak portions and said electrical connection vias;
producing for said first locations back-side integrated parts comprising back-side external electrical connections on a back-side face of the thinned substrate wafer, these back-side external electrical connections being selectively connected to said electrical connection vias; and
destroying the porous silicon weak portions of the substrate wafer so as to singulate integrated-circuit chips formed in said first locations.

10. The process according to claim 9, wherein producing porous silicon weak portions comprises producing weak portions that are deeper than the holes of the electrical connection vias.

11. The process according to claim 9, wherein the porous silicon weak portions are produced by way of an electrochemical etch of said silicon wafer.

12. A process for fabricating integrated-circuit chips, comprising:
producing in a front-side of a silicon substrate wafer a plurality of separate encircling porous silicon weak portions surrounding first locations, the plurality of encircling porous silicon weak portions being spaced apart from one another by transition regions, and each encircling porous silicon weak portion surrounding one first location;
producing in said first locations, on the front-side face of the substrate wafer, front-side integrated parts comprising integrated circuits and front-side electrical connection networks in a front-side layer having a front-side face;
fixing a support wafer to said front-side face by way of regions of holding adhesive fixing said support wafer to said bearing face at said transition regions;
thinning a back side of the substrate wafer so as to expose said porous silicon weak portions;
producing in said first locations holes in the thinned substrate wafer from a back-side face and introducing into these holes an electrically conductive material so as to form electrical connection vias selectively connected to said front-side electrical connection networks;
producing back-side integrated parts comprising back-side external electrical connections on the back-side face of the thinned substrate wafer, said back-side external electrical connections being selectively connected to said electrical connection vias; and
destroying the porous silicon weak portions of the substrate wafer so as to singulate the integrated-circuit chips formed in said first locations.

13. The process according to claim 12, wherein the porous silicon weak portions are produced by way of an electrochemical etch of said silicon wafer.

* * * * *